(12) United States Patent
Park et al.

(10) Patent No.: US 12,028,973 B2
(45) Date of Patent: Jul. 2, 2024

(54) PRINTED CIRCUIT BOARD

(71) Applicant: SAMSUNG ELECTRO-MECHANICS CO., LTD., Suwon-si (KR)

(72) Inventors: Chan Jin Park, Suwon-si (KR); Young Ook Cho, Suwon-si (KR); Hyun Seok Yang, Suwon-si (KR); Ki Joo Sim, Suwon-si (KR); Won Seok Lee, Suwon-si (KR); Mi Jeong Jeon, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/501,253

(22) Filed: Oct. 14, 2021

(65) Prior Publication Data

US 2022/0217842 A1    Jul. 7, 2022

(30) Foreign Application Priority Data

Jan. 5, 2021   (KR) .................. 10-2021-0000972

(51) Int. Cl.
*H05K 1/02* (2006.01)
*H05K 1/09* (2006.01)
*H05K 1/11* (2006.01)

(52) U.S. Cl.
CPC ............. *H05K 1/0298* (2013.01); *H05K 1/09* (2013.01); *H05K 1/115* (2013.01); *H05K 1/11* (2013.01)

(58) Field of Classification Search
CPC ........ H05K 1/0298; H05K 1/09; H05K 1/115; H05K 3/4644; H05K 3/205; H05K 3/025
See application file for complete search history.

(56) References Cited

U.S. PATENT DOCUMENTS 3,791,858 A * 2/1974 McPherson .......... H05K 3/4682
    216/21
4,663,497 A * 5/1987 Reimann ................ H05K 3/423
    216/18

(Continued)

FOREIGN PATENT DOCUMENTS

JP        2018085362 A  *  5/2018
KR   10-2017-0143466 A     12/2017
KR      10-1807621 B1      12/2017

OTHER PUBLICATIONS

English translation (machine) of JP2018085362A, published May 2018.*

*Primary Examiner* — Ishwarbhai B Patel
(74) *Attorney, Agent, or Firm* — Morgan, Lewis & Bockius LLP (57) ABSTRACT

A printed circuit board includes a first insulating layer, a metal layer disposed on one surface of the first insulating layer, a first circuit layer disposed inside the first insulating layer and having one surface exposed to the one surface of the first insulating layer so as to be in contact with one surface of the metal layer, a second circuit layer in contact with the other surface of the metal layer, and a second insulating layer disposed on the one surface of the first insulating layer to cover the metal layer and the second circuit layer. The first and second circuit layers respectively include a metal different from the metal layer.

20 Claims, 6 Drawing Sheets

(56) References Cited

U.S. PATENT DOCUMENTS

| | | | | |
|---|---|---|---|---|
| 5,338,900 A | * | 8/1994 | Schneider | H01L 21/6835 |
| | | | | 174/250 |
| 6,579,600 B1 | * | 6/2003 | Bowen | H01G 4/30 |
| | | | | 428/209 |
| 9,433,106 B2 | * | 8/2016 | Ishida | H05K 3/4602 |
| 9,572,250 B2 | * | 2/2017 | Lee | H05K 1/0298 |
| 9,832,866 B2 | * | 11/2017 | Ahn | H05K 1/09 |
| 2011/0220399 A1 | * | 9/2011 | Niki | H05K 1/115 |
| | | | | 174/258 |
| 2014/0060908 A1 | * | 3/2014 | Park | H01L 21/4857 |
| | | | | 174/262 |
| 2016/0095215 A1 | * | 3/2016 | Furutani | H05K 1/0265 |
| | | | | 216/13 |
| 2017/0362733 A1 | | 12/2017 | Kohiki | |
| 2018/0139842 A1 | * | 5/2018 | Xu | H05K 3/4652 |

* cited by examiner

PRINTED CIRCUIT BOARD

CROSS-REFERENCE TO RELATED APPLICATION(S)

This application claims benefit of priority to Korean Patent Application No. 10-2021-0000972 filed on Jan. 5, 2021 in the Korean Intellectual Property Office, the disclosure of which is incorporated herein by reference in its entirety.

TECHNICAL FIELD

The present disclosure relates to a printed circuit board.

BACKGROUND

In order to cope with the recent trend for light-weight and compact mobile devices, printed circuit boards mounted in mobile devices increasingly need to be lighter, thinner, shorter, and smaller as well.

Meanwhile, in recent years, research into a printed circuit board including an embedded circuit pattern has continued. A material including epoxy and glass fiber is used as a core of a printed circuit board, and the printed circuit board including an embedded circuit pattern is mainly manufactured using a carrier copper clad layer (CCL). A carrier including an ultra-thin copper (Cu) layer is used, and after a surface of the ultra-thin copper layer is bonded to an insulating substrate and thermally compressed, and thereafter, the carrier is peeled off through an exfoliation layer.

In this case, after a circuit is formed on the ultra-thin copper (Cu) layer, an insulating material is stacked on a circuit formation surface, and the carrier is then peeled off, and here, a problem arises in that a circuit layer formed on copper (Cu) is also etched to degrade uniformity of circuit formation.

SUMMARY

Exemplary embodiments provide a printed circuit board including a microcircuit and a microvia.

Exemplary embodiments provide a printed circuit board having improved uniformity of microcircuits.

According to an aspect of the present disclosure, a printed circuit board may include: a first insulating layer; a metal layer disposed on one surface of the first insulating layer; a first circuit layer disposed inside the first insulating layer and having one surface exposed to the one surface of the first insulating layer so as to be in contact with one surface of the metal layer; a second circuit layer in contact with the other surface of the metal layer; and a second insulating layer disposed on the one surface of the first insulating layer to cover the metal layer and the second circuit layer. The first and second circuit layers respectively may include a metal different from the metal layer.

According to an aspect of the present disclosure, a printed circuit board may include: an insulating body including a stacked metal structure including a first copper layer, a second copper layer, and a metal layer disposed between the first copper layer and the second copper layer. The metal layer may include a material different from copper.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or exemplary embodiment, e.g., as to what an example or exemplary embodiment may include or implement, means that at least an example or exemplary embodiment exists in which such a feature is included or implemented while all examples and exemplary embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there may be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (e.g., rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

The drawings may not be to scale, and the relative sizes, proportions, and depictions of elements in the drawings may be exaggerated for clarity, illustration, and convenience.

In the drawings, a first direction may be defined as a stacking direction or a thickness (T) direction, a second direction may be defined as a length (L) direction, and a third direction may be defined as a width (W) direction.

Electronic Device

Figure 1:
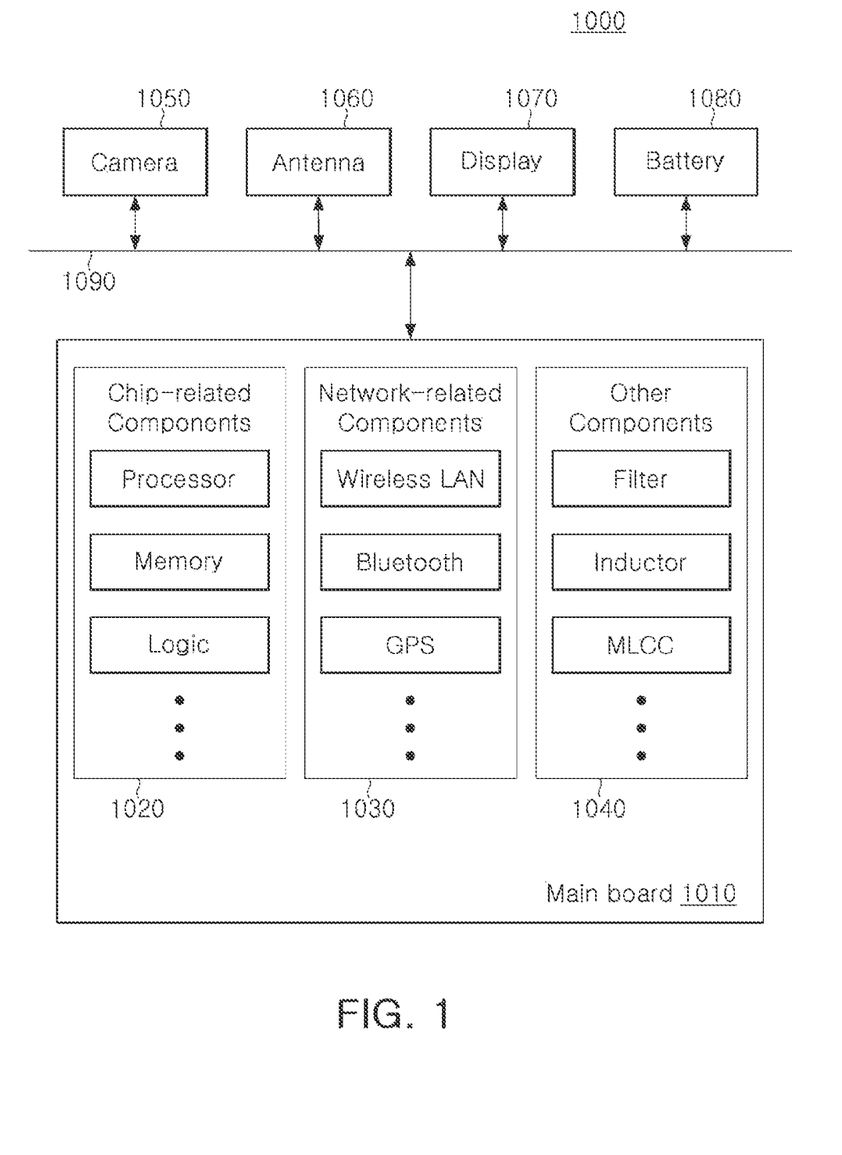
FIG. 1 is a view schematically illustrating an example of an electronic device system.

FIG. 1 is a block diagram schematically illustrating an example of an electronic device system.

Referring to FIG. 1, an electronic device 1000 may accommodate a main board 1010 therein. The main board 1010 may include chip-related components 1020, network-related components 1030, other components 1040, and the like, physically or electrically connected thereto. These components may be connected to other electronic components to be described below to form various signal lines 1090.

The chip-related components 1020 may include a memory chip such as a volatile memory (e.g., a dynamic random access memory (DRAM)), a non-volatile memory (e.g., a read only memory (ROM)), a flash memory, or the like; an application processor chip such as a central processor (e.g., a central processing unit (CPU)), a graphics processor (e.g., a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip-related components 1020 are not limited thereto, and may also include other types of chip related electronic components. In addition, the chip-related components 1020 may be combined with each other. The chip-related components 1020 may be in the form of a package including the aforementioned chips or electronic components.

The network-related components 1030 may include protocols such as wireless fidelity (Wi-Fi) (Institute of Electrical and Electronics Engineers (IEEE) 802.11 family, etc.), worldwide interoperability for microwave access (WiMAX) (IEEE 802.16 family, etc.), IEEE 802.20, long term evolution (LTE), evolution data only (Ev-DO), high speed packet access+(HSPA+), high speed downlink packet access+ (HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network-related components 1030 are not limited thereto, but may also include a variety of other wireless or wired standards or protocols. In addition, the network-related components 1030 may be combined with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components in the form of chip components used for various other purposes, or the like. In addition, other components 1040 may be combined with the chip-related components 1020 and/or the network-related components 1030 described above.

Depending on a type of the electronic device 1000, the electronic device 1000 may include other electronic components that may be or may not be physically or electrically connected to the main board 1010. These other electronic components may include, for example, a camera 1050, an antenna 1060, a display 1070, and a battery 1080. However, without being limited thereto, the electronic components may include an audio codec, a video codec, a power amplifier, a compass, an accelerometer, a gyroscope, a speaker, a mass storage unit (e.g., a hard disk drive), a compact disk (CD) drive, a digital versatile disk (DVD) drive, or the like. In addition, the electronic device 1000 may also include other components used for various purposes depending on a type of the electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
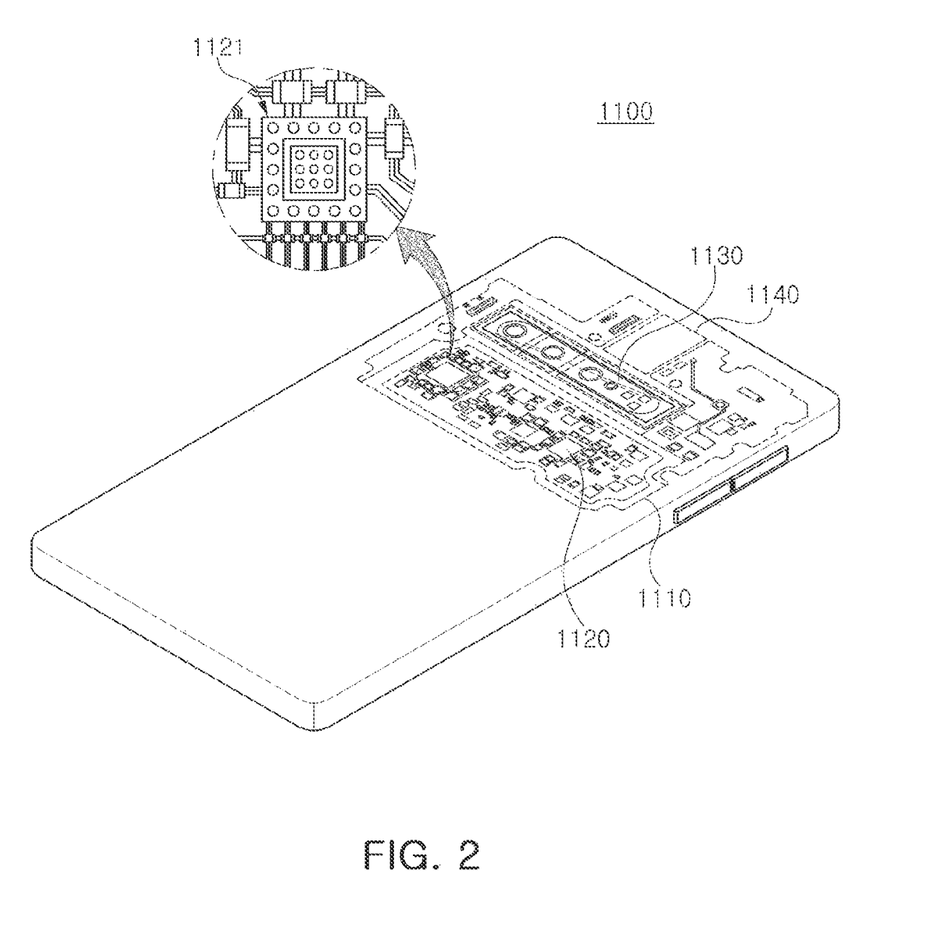
FIG. 2 is a view schematically illustrating an example of an electronic device.

FIG. 2 is a perspective view schematically illustrating an example of an electronic device.

Referring to the drawings, the electronic device may be, for example, a smartphone 1100. A main board 1110 is accommodated in the smartphone 1100, and various electronic components 1120 are physically and/or electrically connected to the main board 1110. In addition, other electronic components that may or may not be physically and/or electrically connected to the main board 1110 such as the camera module 1130 and/or the speaker 1140 are accommodated therein. Some of the electronic components 1120 may be the aforementioned chip-related parts, for example, the antenna module 1121, but are not limited thereto. The antenna module 1121 may be in a form in which an electronic component is surface-mounted on a printed circuit board, but is not limited thereto. Meanwhile, the electronic device is not necessarily limited to the smartphone 1100 and may be other electronic devices as described above.

Structure of Printed Circuit Board and Manufacturing Method

Figure 3:
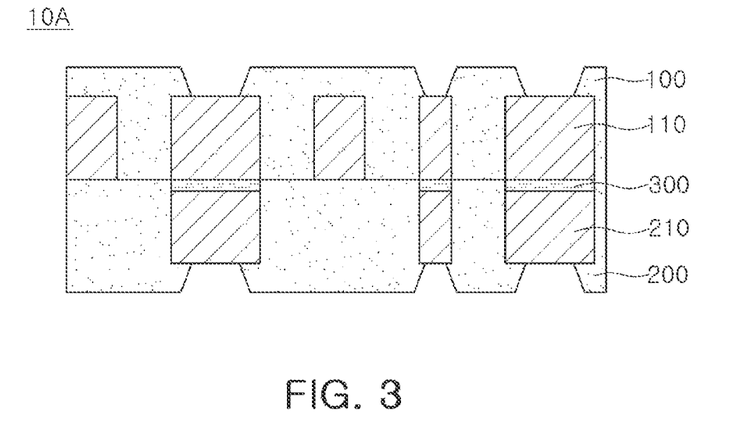
FIG. 3 is a view schematically illustrating an example of a printed circuit board according to the present disclosure.

FIG. 3 is a diagram schematically illustrating an example of a printed circuit board according to the present disclosure.

Referring to FIG. 3, a printed circuit board 10A includes a first insulating layer 100, a metal layer 300 disposed on one surface of the first insulating layer 100, a first circuit layer 110 in contact with one surface of the metal layer 300, a second circuit layer 210 in contact with the other surface of the metal layer 300, and a second insulating layer 200 disposed on one surface of the first insulating layer 100. The first circuit layer 110, the metal layer 300, and the second circuit layer 210, together as a stacked metal structure may be embedded in an insulating body including the first insulating layer 100 and the second insulating layer 200.

The printed circuit board 10A according to the present disclosure may include a via hole penetrating the first and second insulating layers 100 and 200 to expose portions of the first and second circuit layers 110 and 210.

The first circuit layer 110 may be exposed to one surface of the first insulating layer 100 and disposed inside the first insulating layer 100 so as to be in contact with one surface of the metal layer 300.

The first and second circuit layers 110 and 210 may respectively include a metal different from the metal layer 300, and the metal layer 300 may include a plurality of metal layers.

Each of the first insulating layer 100 and the second insulating layer 200 may be a solder resist layer. An opening may be formed in the first insulating layer 100 and the second insulating layer 200 to expose connection pads of the first and second circuit layers 120 and 210 externally.

The first insulating layer 100 and the second insulating layer 200 may include the same material or may include different materials. In addition, the first and second insulating layers 100 and 200 may include a thermosetting resin.

As a material of the first circuit layer 110, the second circuit layer 210, and the metal layer 300, a conductive material such as copper (Cu), aluminum (Al), silver (Ag), tin (Sn), gold (Au), nickel (Ni), lead (Pb), titanium (Ti), palladium (Pd), or alloys thereof may be used.

Here, the first and second circuit layers 110 and 210 may respectively include a metal different from that of the metal layer 300, and the first and second circuit layers 120 and 210 may respectively include a conductive metal having electrical conductivity lower than the metal layer 300.

In particular, as a material of the metal layer 300, at least one of titanium (Ti) and tin (Sn) may be included.

In particular, as a material of the metal layer 300, silver (Ag) may be included, and the first and second circuit layers 110 and 210 may respectively include copper (Cu).

The metal layer 300 and the first circuit layer 110 may include metals different from each other, and a height difference between one surface on which the first circuit layer 110 is in contact with the metal layer 300 and one surface on which the first insulating layer 100 is in contact with the metal layer 300 may be 0.5 µm or less, and one surface of the first circuit layer 110 and one surface of the first insulating layer 100 may be disposed at the same height or level.

In one example, the second insulting layer 200 may cover a side surface of the metal layer 300. That is, the metal layer 300 may be embedded in the second insulating layer 200. A thickness of the metal layer 300 may be less than a thickness of the first circuit layer 110 and a thickness of the second circuit layer 210.

Further, a thickness of the metal layer 300 may be 10 nm or more and 400 nm or less.

FIGS. 4 through 9 are views schematically illustrating a manufacturing process of a printed circuit board 10 according to the present disclosure.

Figure 4:
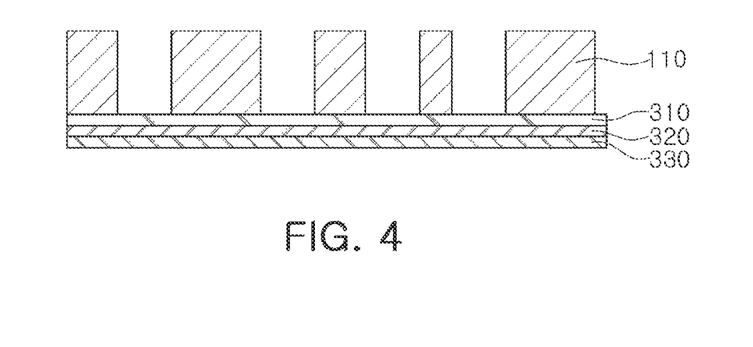
FIGS. 4 through 9 are views schematically illustrating a manufacturing process of a printed circuit board according to the present disclosure.

Referring to FIG. 4, a first metal layer 310 and a second metal layer 320 are disposed on a carrier film 330. The carrier film 330 may include a copper clad laminate (CCL). The types of copper clad laminates include a glass/epoxy CCL, a heat-resistant resin CCL, a paper/phenolic CCL, a high frequency CCL, a flexible CCL, and a composite CCL, etc. depending on their use.

As a material of the first and second metal layers 310 and 320 and the first and second circuit layers 120 and 210, a conductive material such as copper (Cu), aluminum (Al), silver (Ag), tin (Sn), gold (Au), nickel (Ni), lead (Pb), titanium (Ti), palladium (Pd), or alloys thereof may be used.

In particular, as a material of the metal layer 300, at least one of titanium (Ti) and tin (Sn) may be included.

Here, the first and second circuit layers 110 and 210 may respectively include a metal different from the first metal layer 310, and the first and second circuit layers 110 and 210 may respectively include a conductive material having electrical conductivity lower than that of the first metal layer 310.

The second metal layer 320 may be stacked on the carrier film 330 including a carrier copper foil layer, and the carrier copper foil layer and the second metal layer 320 may include copper (Cu). However, the present disclosure is not limited thereto, and the carrier copper foil layer and the second metal layer 320 may include other conductive materials such as aluminum (Al) or the like.

The first circuit layer 110 may be disposed on one surface of the first metal layer 310, and here, the first circuit layer 110 may include a metal different from the first metal layer 310.

The first circuit layer 110 may be formed by disposing a plating resist on one surface of the first metal layer 310, performing a process such as an electrolytic plating method or the like, and subsequently removing the plating resist. The plating resist may be removed by a general method of removing a plating resist. By removing the plating resist, a portion of the metal layer 300 may be exposed.

Figure 5:
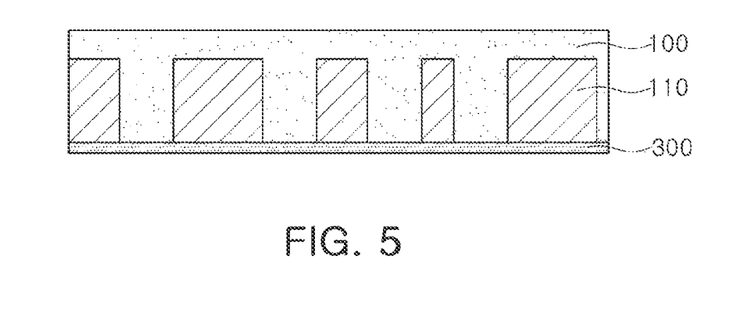

Referring to FIG. 5, the printed circuit board 10 may be manufactured by detaching the carrier film 330 of FIG. 4, and here, the carrier copper foil layer of the carrier film 330 may be removed by a method such as etching or the like.

In the process of removing the carrier copper foil layer, the second metal layer 320 may be detached, but the second metal layer 320 may not be attached and the first metal layer 310 and the second metal layer 320 may be formed as the metal layer 300.

Here, a thickness of the first metal layer 310 may be 10 nm or more and 400 nm or less.

The metal layer 300 may include one surface and the other surface. Thereafter, the first insulating layer 100 may be disposed on one surface of the metal layer 300 to cover the first circuit layer 110. Here, one surface of the first circuit layer 110 may be exposed to one surface of the first insulating layer 100 so as to be in contact with the one surface of the metal layer 300.

Figure 6:
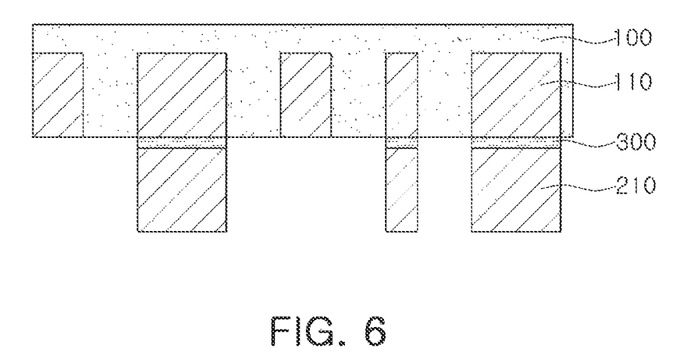
Figure 7:
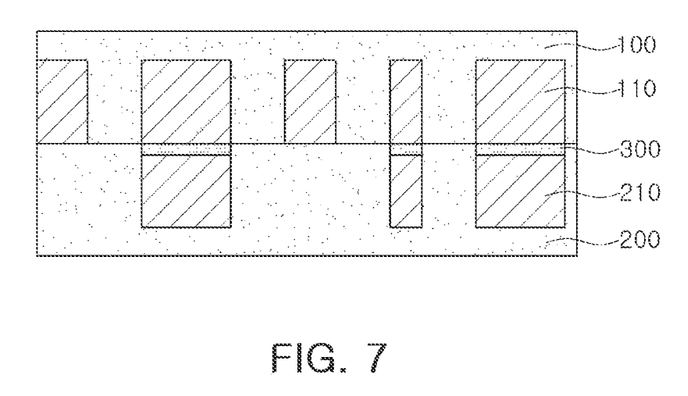

Referring to FIGS. 6 and 7, the metal layer 300 includes one surface and the other surface, and the first insulating layer 100 and the first circuit layer 110 may be disposed on one surface of the metal layer 300, and the second circuit layer 210 may be disposed to be in contact with the other surface of the metal layer 300.

Here, the first and second circuit layers 110 and 210 may be formed by disposing a plating resist on one surface and the other surface of the metal layer 300, respectively, followed by a process such as an electroplating method, and removing the plating resist. The plating resist may be removed by a general method of removing a plating resist. By removing the plating resist, a portion of the metal layer 300 may be exposed.

The metal layer 300 may include silver (Ag) and may be formed to have the same area as the second circuit layer 210 by selectively removing the metal layer 300 by a method such as etching.

The formation of the metal layer 300 may prevent a recess from occurring in the first and second circuit layers 110 and 210. The first and second circuit layers 110 and 210 respectively have one surface in contact with the metal layer 300, and one surface of the respective first and second circuit layers 110 and 210 may be at the same level as one surface of the respective first and second insulating layers 100 and 200.

The metal layer 300 may include a metal having electrical conductivity higher than the respective first and second circuit layers 110 and 210. The metal layer 300 may include silver (Ag).

By forming the second circuit layer 210 on the other surface of the metal layer 300, a risk of loss of electrical characteristics of a microcircuit may be reduced and formation of a via connecting the circuit layer and a build-up circuit layer may be facilitated.

In addition, a portion of the exposed metal layer 300 may be removed. The metal layer 300 may be removed by a method such as etching. The metal layer 300 may be removed except for a portion in contact with one surface of the second circuit layer 210.

The metal layer 300 may include one surface and the other surface, and the second insulting layer 200 may be disposed on one surface of the first insulating layer 100 to cover the second circuit layer 210 and the metal layer 300 in contact with the other surface of the metal layer 300.

Figure 8:
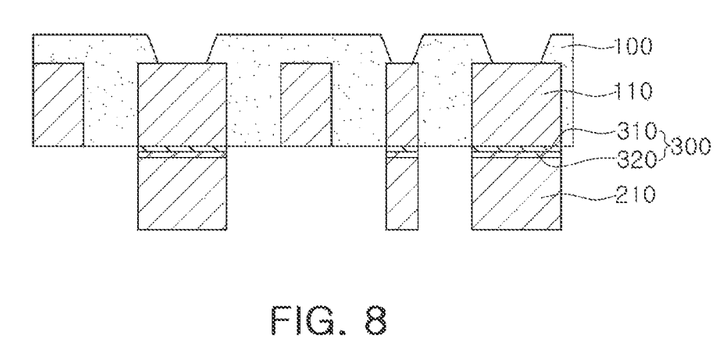

Referring to FIG. 8, the metal layer 300 may include a first metal layer 310 and a second metal layer 320. The first and second metal layers 310 and 320 may be formed to be different depending on whether the second metal layer 320 is removed, referring to FIG. 4. That is, if the second metal layer 320 is removed in FIG. 4, the metal layer 300 may include only the first metal layer 310, and if the second metal layer 320 is not removed or is only partially removed, the metal layer 300 may include the first and second metal layers 310 and 320.

As a material for the first and second metal layers 310 and 320 and the first and second circuit layers 110 and 210, a conductive material such as copper (Cu), aluminum (Al), silver (Ag), tin (Sn), gold (Au), nickel (Ni), lead (Pb), titanium (Ti), palladium (Pd), or alloys thereof may be used.

In particular, as a material of the first metal layer 310, at least one of titanium (Ti) and tin (Sn) may be included.

Here, the respective first and second circuit layers 120 and 210 may include a metal different from the first metal layer 310, and the first and second circuit layers 120 and 210 may respectively include a conductive material having electrical conductivity lower than that of the first metal layer 310.

In addition, the second metal layer 320 may include a metal different from the first metal layer 310. The second metal layer 320 may include a metal having electrical conductivity lower than that of the first metal layer 310.

In particular, as a material of the first metal layer 310, silver (Ag) may be included, and the respective first and second circuit layers 110 and 210 may include copper (Cu). The second metal layer 320 may include copper (Cu), and a thickness of the second metal layer 320 may be 5 μm or less.

The first metal layer 310 and the first circuit layer 110 may include metals different from each other. A height difference between one surface on which the first circuit layer 110 is in contact with the first metal layer 310 and one surface on which the first insulating layer 100 is in contact with the first metal layer 310 may be 0.5 μm or less, and one surface of the first circuit layer 110 and one surface of the first insulating layer 100 may be disposed at the same height or level.

In addition, the first insulating layer 100 and the first circuit layer 110 may be disposed on one surface of the metal layer 300, and the second circuit layer 210 may be disposed to be in contact with the other surface of the metal layer 300.

Here, the first and second circuit layers 110 and 210 may be formed by disposing a plating resist on one surface and the other surface of the metal layer 300, respectively, followed by a process such as an electroplating method, and removing the plating resist. The plating resist may be removed by a general method of removing a plating resist. By removing the plating resist, a portion of the metal layer 300 may be exposed.

Figure 9:
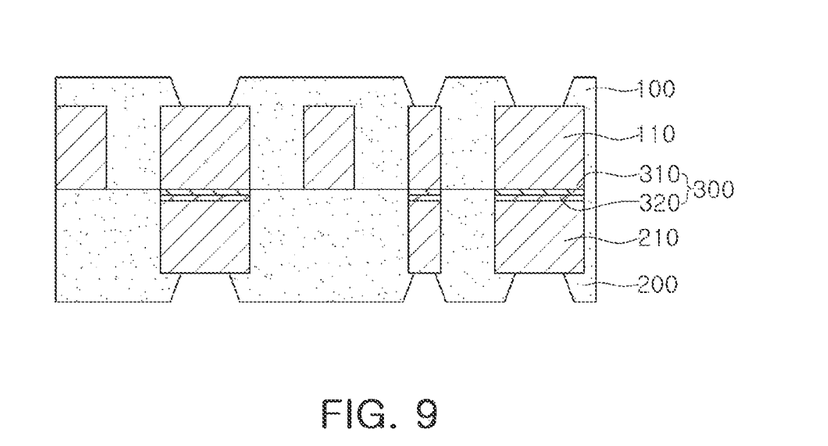

Referring to FIG. 9, the printed circuit board 10 according to the present disclosure may include the second insulating layer 200 on one surface of the first insulating layer 100 to cover the first and second metal layers 310 and 320 and the second circuit layer 210. That is, the second insulating layer 200 may cover sides surface of the first and second metal layers 310 and 320 such that the first and second metal layers 310 and 320 may be embedded in the second insulating layer 200. In addition, the printed circuit board 10 may include a via hole exposing portions of the first and second circuit layers 1109 and 210 through the first and second insulating layers 100 and 200.

Substantially the same descriptions as those described above may be applied to other components, and thus, a detailed description thereof will be omitted.

Figure 10A:
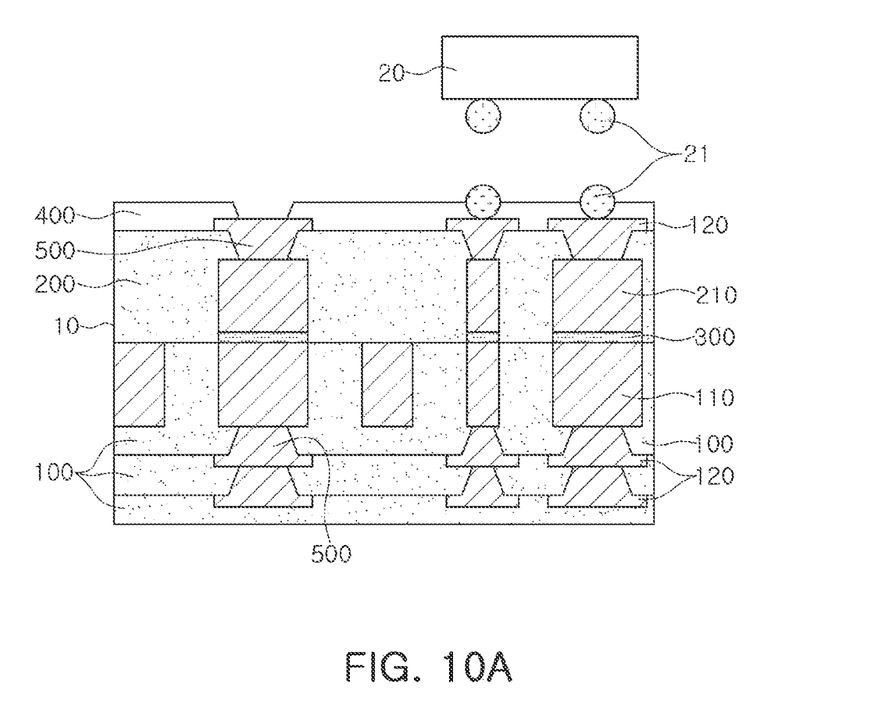
FIGS. 10A and 10B are views schematically illustrating an example of using a printed circuit board according to the present disclosure.
Figure 10B:
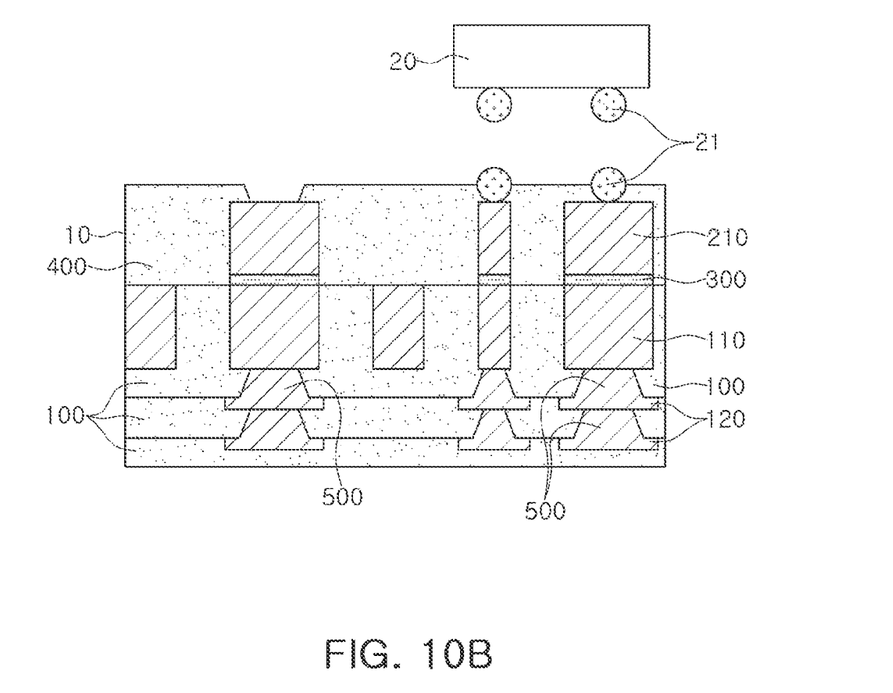

FIGS. 10A and 10B are views schematically illustrating an example of using a printed circuit board according to the present disclosure.

In the printed circuit board according to the present disclosure, a build-up circuit layer 120 may be disposed on at least one of the first insulating layer 100 and the second insulating layer 200, and the build-up circuit layer 120 may be formed of a plurality of layers.

In addition, the printed circuit board may further include a via 500 connecting at least one of the first and second circuit layers 110 and 210 and the build-up circuit layer 120 through at least one of the first insulating layer 100 and the second insulating layer 200.

Referring to FIG. 10A, an electronic component 20 may be connected to the build-up circuit layer 120 disposed on the second insulating layer 200. Here, a connection conductor 21 may be in direct contact the build-up circuit layer 120. The via 500 may connect the first and second circuit layers 110 and 210 and the build-up circuit layer 120 through the first and second insulating layers 100 and 200.

Here, a solder resist layer 400 may be disposed on one surface of the second insulating layer 200. A portion of the second circuit layer 210 may be exposed from the solder resist layer 400 to be connected to the electronic component 20.

Since the second insulating layer 200 is disposed to surround the second circuit layer 210, an interference effect between circuits may be reduced and a circuit for electric signal transmission may be formed in a single layer.

Referring to FIG. 10B, the electronic component 20 may be directly connected to the second circuit layer 210 through the connection conductor 21. Here, a solder resist layer 400 may be disposed in place of the second insulating layer 200. A portion of the second circuit layer 210 may be exposed from the solder resist layer 400 and connected to the electronic component 20.

The printed circuit board 10 according to the present disclosure may be used in a product having an asymmetric structure. In addition, the electronic component 20 may be an active component, and specifically, may be a plurality of dies. The plurality of dies may be connected to each other to implement an application processor. However, the present disclosure is not limited thereto, and the electronic component 20 may be a passive component such as a capacitor or an inductor.

A description of other components may be substantially the same as those described above, and thus, detailed descriptions will be omitted.

As set forth above, one of the various effects of the present disclosure provides a printed circuit board including a microcircuit and/or microvia.

One of the various effects of the present disclosure provides a printed circuit board in which uniformity of a microcircuit is improved.

While example exemplary embodiments have been shown and described above, it will be apparent to those skilled in the art that modifications and variations could be made without departing from the scope of the present disclosure as defined by the appended claims.

What is claimed is:

1. A printed circuit board comprising:
a first insulating layer;
a metal layer disposed on one surface of the first insulating layer;
a first circuit layer disposed inside the first insulating layer and having one surface exposed to the one surface of the first insulating layer so as to be in contact with one surface of the metal layer;
a second circuit layer having one surface in contact with another surface of the metal layer; and
a second insulating layer disposed on the one surface of the first insulating layer in a stacking direction to cover the metal layer and the second circuit layer,
wherein:
the first and second circuit layers respectively include a metal different from the metal layer,
the first circuit layer has another surface opposite the one surface of the first circuit layer in the stacking direction and the second circuit layer has another surface opposite the one surface of the second circuit layer in the stacking direction,
the metal layer includes a first metal layer disposed to be in contact with the first circuit layer and including a metal different from that of the first and second circuit layers, respectively,
a second metal layer disposed to be in contact with the second circuit layer without covering a side surface of the second circuit layer,
the second metal layer includes a metal different from the first metal layer, and
the first insulating layer covers at least a portion of the another surface of the first circuit layer in the stacking direction or the second insulating layer covers at least a portion of the another surface of the second circuit layer in the stacking direction.

2. The printed circuit board of claim 1, wherein electrical conductivity of the first and second circuit layers is lower than electrical conductivity of the metal layer.

3. The printed circuit board of claim 1, wherein the metal layer includes silver (Ag).

4. The printed circuit board of claim 1, wherein the first and second circuit layers respectively include copper (Cu).

5. The printed circuit board of claim 1, wherein electrical conductivity of the second metal layer is lower than electrical conductivity of the first metal layer.

6. The printed circuit board of claim 1, wherein the second metal layer includes copper (Cu).

7. The printed circuit board of claim 1, wherein a thickness of the second metal layer is 5 μm or less.

8. The printed circuit board of claim 1, wherein the one surface of the first circuit layer and the one surface of the first insulating layer are disposed at the same level.

9. The printed circuit board of claim 1, wherein the metal layer includes at least one of titanium (Ti) or tin (Sn).

10. The printed circuit board of claim 1, wherein a thickness of the metal layer is 10 nm or more and 400 nm or less.

11. The printed circuit board of claim 1, further comprising:
a build-up circuit layer disposed on at least one of the first insulating layer or the second insulating layer; and
a via passing through at least one of the first insulating layer or the second insulating layer to connect the build-up circuit layer to at least one of the first or second circuit layers.

12. The printed circuit board of claim 1, wherein the second insulating layer covers a side surface of the metal layer so that the metal layer is embedded in the second insulating layer.

13. The printed circuit board of claim 1, wherein entirety of at least one of the first circuit layer or the second circuit layer, and the metal layer, have widths that are substantially the same as that of an interface therebetween.

14. A printed circuit board comprising:
an insulating body including a stacked metal structure including a first copper layer, a second copper layer, and a metal layer disposed between the first copper layer and the second copper layer, the insulating body including a first insulating layer and a second insulating layer disposed on the first insulating layer in a stacking direction,
wherein the second insulating layer covers at least a side surface of the metal layer,
wherein the metal layer includes a first metal layer disposed to be in contact with the first circuit layer and including a metal different from that of the first and second circuit layers, respectively, and a second metal layer disposed to be in contact with the second circuit layer without covering a side surface of the second circuit layer,
wherein the second metal layer includes a metal different from the first metal layer, and wherein entirety of at least one of the first copper layer or the second copper layer, and the metal layer, have widths that are substantially the same as that of an interface therebetween.

15. The printed circuit board of claim 14, wherein the metal layer includes one of silver (Ag), titanium (Ti), or tin (Sn).

16. The printed circuit board of claim 14, wherein the metal layer is in contact with the first copper layer and the second copper layer.

17. The printed circuit board of claim 16, wherein a thickness of the metal layer is less than a thickness of the first copper layer and a thickness of the second copper layer.

18. The printed circuit board of claim 14, further comprising a third copper layer disposed between the metal layer and the second copper layer.

19. The printed circuit board of claim 18, wherein the metal layer is in contact with the first copper layer and the third copper layer, and
the second copper layer is in contact with the third copper layer.

20. The printed circuit board of claim 18, wherein a sum of thicknesses of the metal layer and the third copper layer is less than a thickness of the first copper layer and a thickness of the second copper layer.

* * * * *